US 6,653,734 B2

(12) United States Patent
Flanner et al.

(10) Patent No.: US 6,653,734 B2
(45) Date of Patent: Nov. 25, 2003

(54) CONVERTIBLE HOT EDGE RING TO IMPROVE LOW-K DIELECTRIC ETCH

(75) Inventors: Janet M. Flanner, Union City, CA (US); Susan Ellingboe, Fremont, CA (US); Christine Janowiak, Fremont, CA (US); John Lang, Milpitas, CA (US); Ian J. Morey, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 99 days.

(21) Appl. No.: 10/066,118

(22) Filed: Jan. 30, 2002

(65) Prior Publication Data

US 2003/0045101 A1 Mar. 6, 2003

Related U.S. Application Data

(62) Division of application No. 09/502,864, filed on Feb. 11, 2000, now Pat. No. 6,383,931, which is a continuation of application No. 09/502,864.

(51) Int. Cl.$^7$ ...................... H01L 23/48; H01L 21/4763
(52) U.S. Cl. ...................... 257/758; 257/759; 438/622; 438/623; 438/637
(58) Field of Search ................................ 257/758, 759, 257/622, 623, 637, 640, 689, 690, 716, 719, 734, 745

(56) References Cited

U.S. PATENT DOCUMENTS

| | | | |
|---|---|---|---|
| 4,473,437 A | 9/1984 | Higashikawa et al. ...... 156/643 |
| 4,529,860 A | 7/1985 | Robb .................... 219/121 PE |
| 4,589,952 A | 5/1986 | Behringer et al. .......... 156/628 |
| 5,217,920 A | 6/1993 | Mattox et al. ................. 437/67 |
| 5,534,751 A | 7/1996 | Lenz et al. |
| 5,569,356 A | 10/1996 | Lenz et al. |
| 5,710,407 A | * 1/1998 | Moore et al. ................ 219/405 |
| 5,811,356 A | * 9/1998 | Murugesh et al. ........... 438/711 |
| 5,821,621 A | * 10/1998 | Jeng ............................ 257/759 |
| 6,468,894 B1 | * 10/2002 | Yang et al. .................. 438/622 |

FOREIGN PATENT DOCUMENTS

| | | | |
|---|---|---|---|
| JP | 58087824 | 5/1983 | ......... H01L/21/302 |
| JP | 60170238 | 9/1985 | ......... H01L/21/302 |

OTHER PUBLICATIONS

Standaert et al., "High–Density Plasma Etching of Low Dielectric Constant Materials", 1998 MRS Spring Symposium, San Francisco, CA, USA, Apr. 14–16, 1998, vol. 511, pp. 265–275.

* cited by examiner

Primary Examiner—T. N. Quach
(74) Attorney, Agent, or Firm—Beyer Weaver & Thomas, LLP

(57) ABSTRACT

Two-step process to improve low-K dielectric etch uniformity, apparatus to perform the method, and semiconductor devices formed in accordance with the method. In a first etching step, an insulating hot edge ring is provided. When the photoresist clearing signal is observed using end-point software, the insulating cover is moved aside to expose the conductive edge ring for the remainder of the etch. One aspect of this invention contemplates an insulator cover over a conductive edge ring at the start of wafer etching, which cover is removed after end-pint detection. The present invention contemplates a number of physical configurations whereby the insulator ring is urged into, and away from, its masking of the conductive edge ring.

Alternatively, the etching of a wafer bearing low-K material may be conducted using two edge rings, where the first etch step is conducted using an insulating hot edge ring, and a second etch step is conducted using a conductive hot edge ring. According to this aspect, the two step process may thus be performed in a plurality of reactor vessels, or in one reactor vessel having a plurality of processing stations.

Different low-K materials may require differing etchant/passivant/diluent combinations. Accordingly, the two-step etch process is taught in conjunction with any number of different etch chemistries.

19 Claims, 7 Drawing Sheets

CONVERTIBLE HOT EDGE RING TO IMPROVE LOW-K DIELECTRIC ETCH

This is a Divisional application of prior application Ser. No. 09/502,864, filed on Feb. 11, 2000, now U.S. Pat. No. 6,383,931 which is a continuation of prior application Ser. No. 09/502,864 filed on Feb. 11, 2000, U.S. Pat. No. 6,383,931, the disclosure of which is incorporated herein by reference.

CROSS-REFERENCE TO RELATED APPLICATIONS

This application is related to the following applications, which are incorporated herewith by reference:

(1) U.S. patent application Ser. No. 09/135,419, U.S. Pat. No. 6,114,250 entitled "TECHNIQUES FOR ETCHING A LOW CAPACITANCE DIELECTRIC LAYER ON A SUBSTRATE"; and (2) U.S. patent application Ser. No. 09/347,582, entitled "TECHNIQUES FOR ETCHING A LOW CAPACITANCE DIELECTRIC LAYER".

BACKGROUND OF THE INVENTION

1. Field of the Invention

The present invention relates to the manufacture of semiconductor devices. More particularly, the present invention teaches a novel method for etching semiconductor devices incorporating low dielectric constant organic films, such as SiLK®, while maintaining one or more desirable feature attributes, including feature critical dimension.

2. Description of Related Art

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, K, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-K materials", have been developed. Many of these new dielectrics are organic compounds.

Low-K materials include, but are specifically not limited to: benzocyclobutene or BCB; Flare™ manufactured by Allied Signal® of Morristown, N.J.; one or more of the Parylene dimers available from Union Carbide® Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

SiLK® has a dielectric constant of 2.65, can be processed at temperatures up to 490° C., and is compatible with metals such as aluminum Al, copper Cu, and the barrier materials titanium Ti, and tantalum Ta. These properties make this material suitable for all existing complementary metal oxide semiconductor, or CMOS, interconnect technologies which implement aluminum lines and tungsten vias, as well as copper/damascene technologies.

During semiconductor wafer processing, features of the semiconductor device are defined in the wafer using well-known patterning and etching processes. In these processes a photo resist material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer.

The development of an effective etching process for an organic low-K film such as SiLK® must take into account several criteria including etch rate, profile control, selectivity to underlying materials as well as hardmask and critical dimension (CD) control. The etching of low-K dielectric materials was at first approached as if a silicon-based dielectric were being etched. In the case of organic low-K films however, other chemistries and processes are often needed to effectively etch the material.

Etching may be accomplished in a dual-frequency capacitively-coupled, (DFC) dielectric etch system. One such is Lam Research™ model 4520 XLE™, available from Lam Research™ Corporation, Fremont Calif. A simplified view of this system is shown at FIG. 1. Having reference to that figure, the system, 1, operates with two different frequencies coupled to the top and bottom electrodes respectively, 5 and 7. The frequencies used in this system are 27 MHz and 2 MHz, respectively, but alternate frequencies may also be implemented. The dual frequencies implemented in the system are provided by frequency drives 17 and 19. This system provides total etching power of up to 3000 watts. This system utilizes rings, for instance 13, at the wafer edge to keep the etching plasma confined. Processes are typically run at pressures of 100–300 mT, which are maintained within chamber 15. The gap between the electrodes can be adjusted as required for the process, by means of a gap drive, 3. Finally, the wafer is held for processing by means of an electrostatic chuck, 9, formed in conjunction with the lower electrode 7. Not shown in this diagram is the system for maintaining pressures within chamber 15. Study of the principles hereinafter enumerated will render evident to those having skill in the art that these principals are applicable to a wide variety of semiconductor etching systems. Such systems incorporate a broad range of operating features and parameters, and the principles later detailed specifically contemplate their implementation in all such etching systems, within the range of operating parameters defined herein.

Low-K organic polymers, such as SiLK® can be etched via an oxidation (e.g. oxygen-based) or a reduction (e.g. hydrogen-based) chemical process. Because of the strong chemical nature of an oxygen-based etch an isotropic profile will result, unless a passivant such as a fluorocarbon or a hydrocarbon is added to protect the sidewalls during the etch. Although chemistries that use fluorocarbons as passivants give reasonable etch rates and profile control, the free fluorine from the fluorocarbon causes poor selectivity to the oxide hardmask. This particularly affects corner selectivity where the oxide hardmask is first exposed, and as a result CDs are degraded. At least two different oxygen-based chemistries have been utilized to etch low-K materials: $N_2/O_2/H_2$ and $N_2/O_2$/hydrocarbon, especially $CH_4$ and $C_2H_4$.

To facilitate discussion, FIG. 2 illustrates a representative layer stack 100 during the etch process, including a photoresist layer 102, a hard mask layer 104, a low capacitance dielectric layer 106, and an etch stop layer 108. Stack 100 is disposed on a substrate, for instance a wafer, not shown in this view. Etch stop layer 108 may represent, for example, an etch stop layer for a dual damascene process and is typically formed of a suitable etch stop material such as TiN, SiN, tetraethylorthosilicate or TEOS, or the like. Low capacitance dielectric layer 106 represents a layer of one of the organic low-K materials previously discussed.

Above low capacitance dielectric layer 106, there is shown disposed a hard mask layer 104, which is typically formed of a material including but not limited to SiN, silicon oxynitride or SiON, and TEOS. Hard mask layer 104 represents the masking layer that is employed to etch the via/trench in low capacitance dielectric layer 106. Each of the layers in the stack are ultimately disposed on the surface of a wafer, not shown in this view. The hard mask layer is employed since photoresist is typically ineffective as a masking material when etching the organic low-K material of low capacitance dielectric layer 106. This is because the photoresist material and the organic low-K material tend to have similar chemical characteristics, tend to require a similar etch chemistry, and/or tend to have a similar etch rate. To pattern the hard mask out of hard mask layer 104, photoresist layer 102 is provided. Photoresist layer 102 may represent, for example, a layer of deep UV or conventional photoresist material.

Photoresist layer 102 has been patterned using a conventional photoresist patterning process. The patterning of photoresist layer 102 creates an opening through which hard mask layer 104 was etched in a subsequent hard mask etch process. In one example, hard mask layer 104 represents a TEOS layer, and the hard mask etch process may take place in a plasma processing reactor using a suitable TEOS etch chemistry such as $Ar/C_4F_8/C_2F_6/O_2$ or a conventional TEOS etchant.

In FIGS. 2 and 3, the low capacitance dielectric layer 106 is being etched. The etching of low capacitance dielectric layer 106 typically takes place in a plasma processing reactor. Low capacitance dielectric layer 106 is typically etched using an oxygen-radical containing gas, including but not limited to $O_2$, $CO$, $CO_2$, or the like. A diluent such as $N_2$ is typically added to the etchant gas employed to etch through the low capacitance dielectric material. A passivating agent such as a fluorocarbon gas is also typically added to the etch chemistry.

Fluorocarbons which have been found to be useful as passivants include, but are not limited to $C_4F_8$, $C_2HF_5$, $CH_2F_2$. However, as shown at FIG. 4 and later discussed, while the addition of the fluorocarbon passivating agent helps preserve the vertical sidewall profile, it tends to facet first the photoresist and subsequently the hard mask, which in turn enlarges opening 202 as the etch proceeds through low capacitance dielectric layer 106. Since the fluorine in etch processes utilized hydrofluorocarbons enhance hard-mask loss, and since some low-K material, including SiLK® do not contain silicon, there is no need to include fluorine in the etch gases.

As the low-K material is often a similar chemical composition to the photoresist, the etching of the low-K material causes a concomitant etching of the photoresist, as is later explained. The photoresist layer survives for a period of time during the low-K etch step, and after the photoresist has been consumed, the hard mask remains during the remainder of the low-K etch, as shown at FIG. 3. Following completion of the etch step, further fabrication steps are employed. By way of example but not limitation, the trench or via formed at 202 may be filled with a metal, which is deposited by any known means. Thereafter the deposited metal layer may be polished, for instance by means of a chemical mechanical polish or CMP, to remove the metal layer down to the hard layer, thus leaving the via, or trench filled with metal interconnects. These latter fabrication steps are not shown in this figure.

As is well known, the oxygen species employed to etch through low capacitance dielectric layer 106 tends to etch isotropically, causing the sidewalls in opening 202 to bow instead of maintaining the desired vertical sidewall profile. The bowing effect is exacerbated if over-etching is required to compensate for etch nonuniformity across the wafer. This bowing effect degrades profile control, for example, causing the formation of re-entrant profiles, which are profiles that have angles greater than 90 degrees, and cause difficulties in subsequent processing steps such as metal fill.

The oxygen species that is employed to etch through the low capacitance dielectric layer 106 also attacks the overlying photoresist material in layer 102. Consequently, the thickness of photoresist layer 102 is reduced as the etch proceeds through low capacitance dielectric layer 106.

As shown at FIG. 4, because the oxygen species attacks the photoresist material 102 isotropically, the photoresist mask often pulls back in certain regions of the via/trench, for instance as shown at 401 and 401'. As the photoresist material is worn away by the oxygen species and the photoresist material is pulled back, the TEOS hard mask material of hard mask layer 104 is exposed to the fluorocarbon that is added for passivation purposes. Since fluorocarbon is also an etchant of TEOS, the exposed hard mask material is also etched away during the low-K etch process, for instance at 403 and 403', causing the opening in hard mask layer 104 to enlarge. This faceting of the opening in hard mask layer 104 in turn enlarges the via/trench to be etched through low capacitance dielectric layer 106. With this enlargement, the critical dimension of the via/trench may be lost.

The use of a fluorocarbon additive also narrows the process window of the low capacitance dielectric layer etch. If too much fluorocarbon is added to the etch chemistry, the etch rate of the low capacitance dielectric layer will be reduced dramatically, until etch stoppage eventually occurs. If too little fluorocarbon is added, there may be insufficient passivation to maintain the desired vertical sidewall profile.

Even where appropriate etchant/diluent/passivant combinations are employed, uniformity of the etch process across the surface of the wafer is often a problem. In one instance, it was observed that in the manufacture of semiconductors, including at least one layer of low-K material, an oxide hard mask and a layer of organic photoresist, the etching process employed to form the device proceeded at different rates across the surface of the wafer. What is needed is the determination of the causation of the uneven etching of low-K materials in combination with photoresist and oxide hard masks.

Upon the determination of one or more causes of uneven etching, what accordingly is necessary is a methodology which improves the uniformity of the etch process in fabricating a semiconductor device which include one or more layers of low-K material, photoresist and hard mask.

Finally, what is needed is at least one etch chemistry which will operate with the method to maintain critical dimension, minimize isotropicity and hard mask faceting while providing for an acceptable etch rate for the fabrication of the device.

These and other features of the present invention will be described in more detail in the section entitled detailed description of the invention and in conjunction with the following figures.

SUMMARY OF THE INVENTION

The present invention teaches a two-step process to improve low-K dielectric etch uniformity on a wafer bearing a low-K layer, a hard mask layer, and a photoresist layer. The etching process takes place in a reactor vessel. According to a first aspect of the present invention, in a first etching step while photoresist is present the low-K material is etched using a first etchant including an oxygen-bearing compound and a hydrocarbon passivant in the presence of a radio-frequency insulative edge ring. When the photoresist is determined to be substantially cleared from the wafer, for instance by means of a clearing signal generated by detectors and end-point software, a second etching step is performed. In the second etching step, the low-K material is etched using a second etchant including an oxygen-bearing compound and a hydrocarbon passivant in the presence of a radio-frequency conductive edge ring. Hydrocarbons may, in accordance with another aspect of the present invention, further include hydrofluorocarbons.

According to one aspect of the present invention, in some cases the first and second etchants may be identical. According to another aspect of the present invention, the first and second etchants may be different, either by virtue of different oxygen-bearing compounds or different hydrocarbons, or by different concentrations of at least one of the oxygen-bearing compound and the hydrocarbon.

According to yet another aspect of this invention, a diluent may be added to at least one of the first and second etchants. Where diluents are included in both etchants, they may be identically composed and concentrated in both etchants, or they may differ by virtue of chemical composition or concentration within their respective etchants.

Different combinations of low-K materials, hard mask materials and photoresists may require different etchant/passivant/diluent combinations, and examples of these are chemistries are presented in the section entitled "Detailed Description of the Invention".

According to yet another aspect of this invention an insulative cover is provided over a radio-frequency conductive edge ring to provide the radio-frequency insulative edge ring. the insulating cover is moved aside to expose the conductive edge ring for the second etching step. The present invention contemplates a number of physical configurations whereby the insulator ring is urged into, and away from, its masking of the radio-frequency conductive edge ring.

Alternatively, still another aspect of the present invention contemplates the etching of the wafer may be conducted in two locales, where the first etch step is conducted using an insulating hot edge ring at a first locale in a reactor vessel. The wafer is then moved to a second locale and a second etch step is conducted using a conductive hot edge ring. These two steps may be performed in a series of reactor vessels, or in one reactor vessel having a plurality of processing stations.

These and other advantages of the present invention will become apparent upon reading the following detailed descriptions and studying the various figures of the Drawing.

BRIEF DESCRIPTION OF THE DRAWING

For more complete understanding of the present invention, reference is made to the accompanying Drawing in the following Detailed Description of the Invention. In the drawing.

Figure 1:
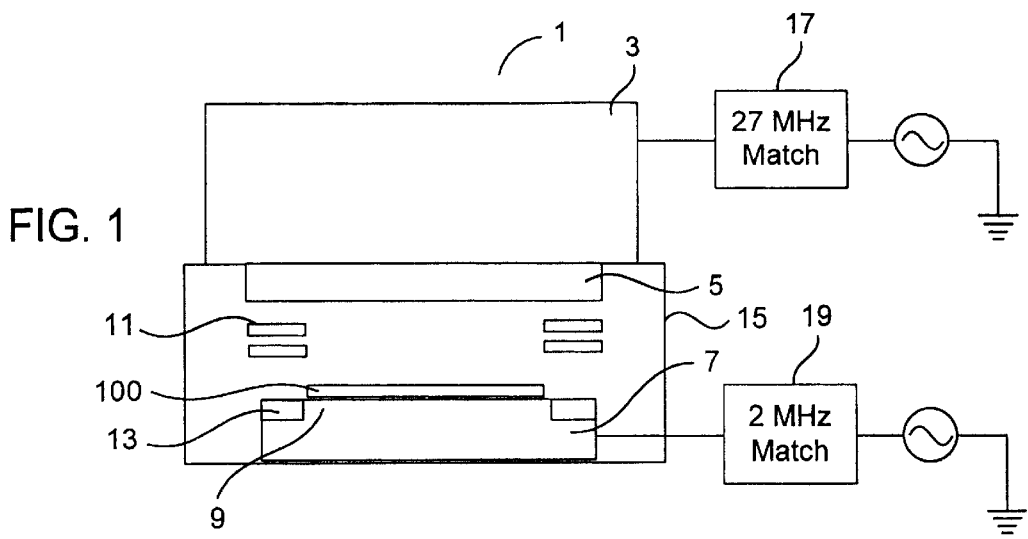
FIG. 1 is a simplified cross-sectional diagram of one reactor vessel suitable for carrying out the present invention.

Reference numbers refer to the same or equivalent parts of the invention throughout the several figures of the Drawing.

DETAILED DESCRIPTION OF THE INVENTION

A study was conducted to determine at least one cause of non-uniform etching across the surface of a wafer having a layer stack including a low-K layer, an oxide-bearing hard mask layer, and a photoresist layer. The wafers had contacts thereon having features ranging in size from 0.25–0.5 $\mu$m. In the study, a number of test plasma etches were made. All etches were made on patterned 8 inch Si wafers, utilizing a Lam Research™ model 4520 XLE™ dual-frequency capacitively-coupled (DFC) dielectric etch system.

In order to better understand the nature of the present invention, a discussion of some of the underlying chemistry is presented herewith. Two different types of chemistries will be presented and discussed here: $N_2/O_2/H_2$ and $N_2/O_2/$ hydrocarbon, especially the hydrocarbons $CH_4$ and $C_2H_4$.

The first chemistry that was explored was $N_2/H_2/O_2$. Although initial studies showed that $N_2/H_2$ could etch SiLK® alone, large variations in the process showed limited effects on the etch rate and profile. It was found that increasing $O_2$ flows increased the etch rate significantly. The partial etch has a very straight profile with minimal faceting of the TEOS hardmask. However, it was evident that once the via was etched to the bottom, the profile bowed upon overetch. This passivation was not effective enough to prevent the lateral component of the etch.

To further explore the process window of this chemistry, additional experiments were conducted in which $O_2$ flow was varied from 0 to 10 sccm, and $H_2$ and $N_2$ gas flows were varied from 100 to 300 sccm. Etch rate, CD control and profile were studied in this experiment. Pressure, power and temperature were held constant. The chamber pressure was set at 50 mT, total power was set at 1000 W, and lower electrode temperature was 10° C. The results of the experiment include:

The etch rate increased with $O_2$, $N_2$ and $H_2$ flow, where $O_2$ was the most significant etching factor, followed by $N_2$ and to a lesser degree $H_2$.

While the vertical etch rate increased with increasing $O_2$, so did the lateral etch rate, which resulted in profiles that became re-entrant upon overetch.

Increasing the $H_2$ or $N_2$ flows by factors of 200% resulted in an increase of the etch rate by only 20–30%.

Because fluorocarbons provided adequate sidewall passivation, but too much hardmask faceting, hydrocarbons were investigated as passivants. Compared to the fluorocarbons, $CH_2$ demonstrated better selectivity and less faceting of the TEOS hardmask. However, the profile, even before etch completion, was re-entrant even with high $CH_4$ flows. The double-bonded structure of the $C_2H_4$ makes it a more polymerizing gas than $CH_4$ and subsequently a better sidewall passivant. $C_2H_4$ provides sufficient passivation to control the profile with overetch.

Once the process chemistry was established, the process was studied in more detail. There are three regimes in the etch process which should be considered:

1. While photoresist is present. The benefits of sidewall passivation have been discussed. At the beginning of the etch the entire wafer surface is covered with organic material, i.e. PR and SiLK®. This results in an oxygen-starved etch environment in which the free oxygen radicals are adsorbed on the wafer surface, as opposed to reacting with the hydrocarbon precursors in the plasma phase. At the same time, polymer formation is occurring with the hydrocarbon precursors and etch products, and the resultant polymers are depositing on the wafer surface. This polymer formation, as well as the oxygen starved environment results in a lower etch rate and a decreased need for passivation. The process window for profile control is large, as there is sufficient $C_2H_4$ available to aid in sidewall passivation.

2. After photoresist has cleared. Once the PR clears, the plasma chemistry changes significantly because of the amount of exposed organic material. The 100% organic etch surface (i.e. SiLK® and PR) can be reduced to <1% for a via etch pattern. As a consequence, the need for a passivating gas for profile control is greater. The etch rate will be increased since there is now an increase in atomic oxygen radicals available for etching. Also the hardmask is now exposed, leading to more faceting of the hardmask due to ion bombardment. Fortunately there is no fluorine in the process to enhance the chemical component of the oxide etch. An advantage of operating in this regime is that, the etch rate can increased by a factor of 2.

3. Overetch. After the SiLK® etch is complete, the oxygen radicals will begin to break down the thin layer of sidewall passivation and this will eventually result in a bowed or re-entrant profile. Depending on the thickness of the PR and SiLK®, the photoresist may still be present when the SiLK® clears. Consequently, the overetch tolerance has a strong dependence on the film stack structure.

Figure 4:
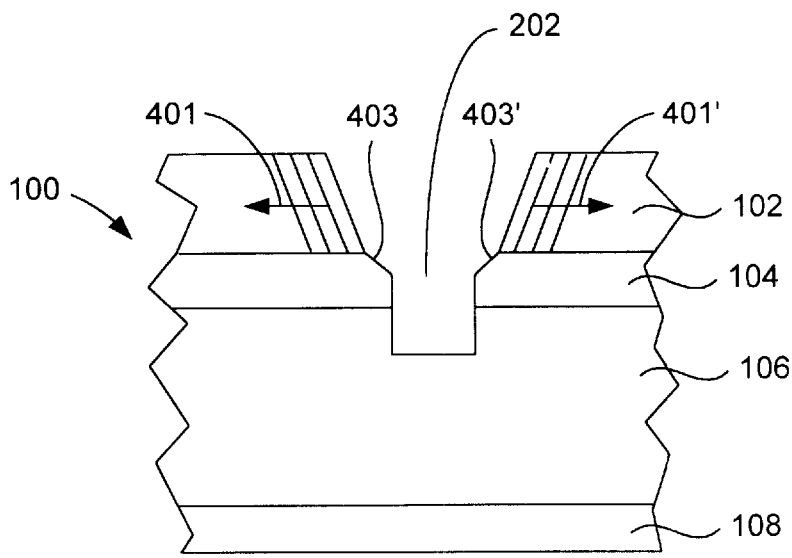
FIG. 4 is a cross-section through a representative stack disposed on a substrate during a low-K etching step, where the photoresist layer is still present, and faceting of a hardmask layer beneath the photoresist is occurring.

Further investigation of the $N_2/O_2/C_2H_4$ process chemistry was done on wafers which had the TEOS hardmask opened, and the PR was stripped prior to beginning the SiLK® etching. A three factor experiment was run with the $C_2H_4$ chemistry where $O_2$ flow was varied from 10 to 30 sccm, $C_2H_4$:$O_2$ ratio from 2:3 to 3:2, and power from 700 to 1300 W total. Etch rate, profile, and hardmask facet were evaluated (FIG. 4). The samples consisted of wafers that were stripped of photoresist and had 0.1 $\mu$m of TEOS mask that was opened prior to PR strip and 1.0 $\mu$m SiLK® over an Si substrate. Wafer pressure of 150 mT, nitrogen flow of 500 sccm, and lower electrode temperate. of 10° C. were held constant.

The biggest effect on etch rate was the $O_2$:$C_2H_4$ ratio. Although $C_2H_4$ is primarily used for profile control, it will deposit polymer at the bottom of the via as well, significantly slowing the etch rate.

The following observations were drawn from these experiments:

The etch rate increased with oxygen flow; however, inadequate passivation of the via sidewalls tended to occur with the increase and profiles became reentrant.

The ratio of $C_2H_4:O_2$ flows was the biggest factor in controlling profile and, within the range of the experiment, was independent of the flow of the gases.

Increased power had some effect on increasing etch rate, but an increase in hardmask facet was also seen.

Similar investigations were conducted with other organic low-K materials, including Flare™ made by Allied Signal. Different materials sometimes required different etchant/diluent/passivant combinations, as illustrated in the following table:

| Low-K material | Preferred etchant/diluent/passivant species |
| --- | --- |
| SiLK ® | $O_2/N_2/C_2H_4$ |
| Flare ™ | $O_2/N_2/C_2H_4$ |
| BCB | $O_2/N_2$/hydrocarbon or fluorocarbon |
| PTFE | $O_2/N_2$/hydrocarbon or fluorocarbon |
| Parylene | $O_2/N_2$/hydrocarbon |

Optimal flow rates for each of these species is empirically determined with reference to the equipment and power levels utilized to conduct the etching, as well as to other process variables.

The realization that O species are the most important etchant component for many organic low-K materials, coupled with the fact that the organic covering, i.e. PR and SiLK®, results in an oxygen-starved etch environment, triggered further investigation into the part that O distribution plays in the non-uniformity of etching of low-K materials.

Figure 5:
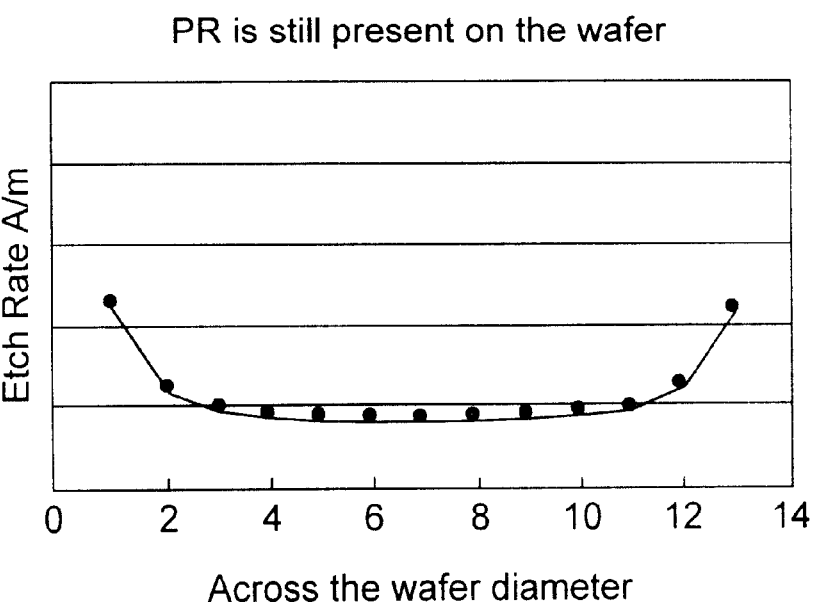
FIG. 5 is a graphical representation of the etch rate of a low-K layer on a wafer stack including a low-K layer, a hard mask layer and a photoresist layer, while photoresist is still present on the wafer, the low-K etch rate being plotted across the wafer diameter.

With reference to FIG. 5, a first non-uniformity is discussed. It was discovered that where a substantial amount of photoresist, for instance greater than about 1% coverage, remained on the wafer during low-K oxygen-based plasma etch, the etch rate was significantly higher at the edges of the wafer than at the middle. From these results, it is postulated that the photoresist material rapidly consumes O species, and that therefore the low-K etching process is essentially O species rate-limited, with O species diffusing inward from the edge of the wafer.

Figure 2:
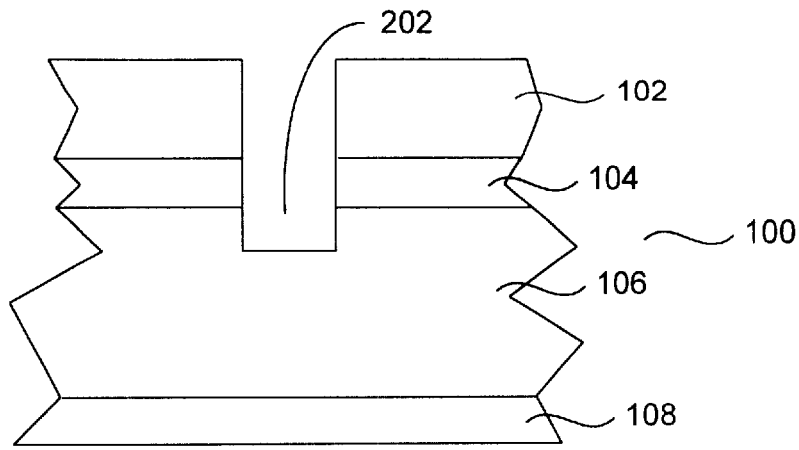
FIG. 2 is a cross-section through a representative stack disposed on a substrate at the beginning of a low-K etching step, where the photoresist layer is still present.
Figure 7:
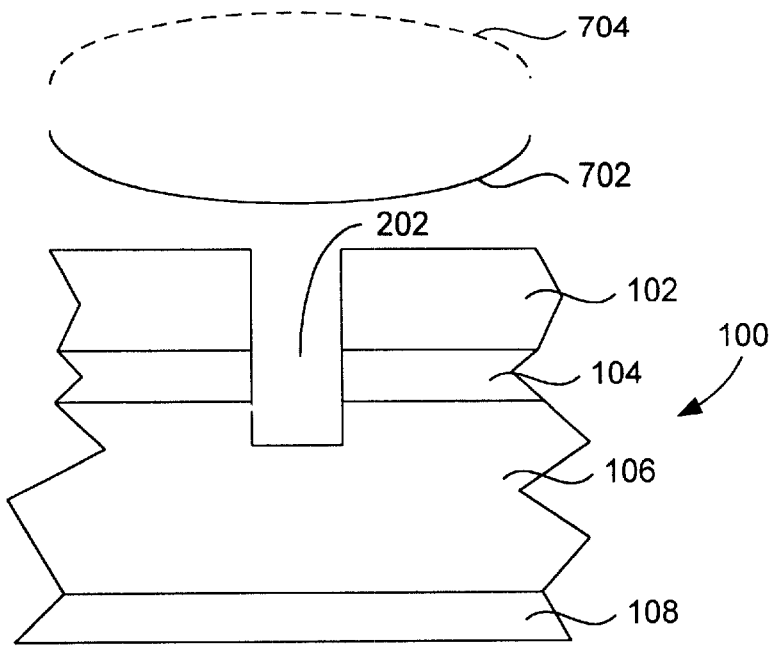
FIG. 7 is a cross-section through a representative stack disposed on a substrate at the beginning of a low-K etching step, where the photoresist layer is still present, showing the etch rate across the wafer diameter, and the plasma ion flux during the etch.

Having reference to FIG. 7, the results of this test are shown. FIG. 7 depicts a cross-section through a wafer stack 100 as in FIG. 2, the cross section shown during the low-K etch process while photoresist 102 is substantially present. The plasma etch ion flux is shown at 704, and the postulated O species density shown at 702. At 702, it is shown that the O species density is higher at the edges and lower towards the center of the wafer during oxygen based etching in the presence of an organic photoresist.

Figure 6:
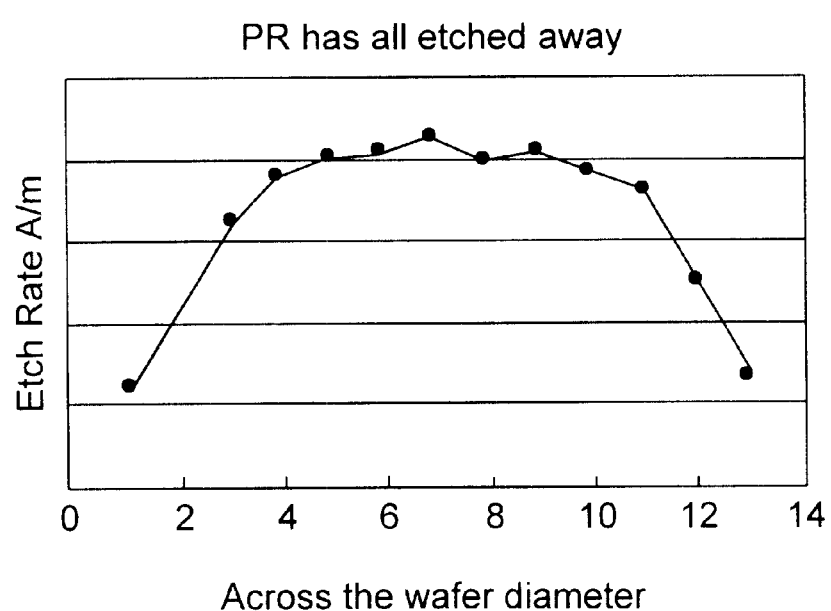
FIG. 6 is a graphical representation of the etch rate of a low-K layer on a wafer stack including a low-K layer and a hard mask layer, where previously applied photoresist has been substantially cleared from the wafer, the low-K etch rate being plotted across the wafer diameter.

In contrast, and having reference now to FIG. 6, a second non-uniformity is discussed. It was further discovered that when the photoresist was substantially removed from the surface of the wafer, for instance less than 1% coverage, that the low-K oxygen-based plasma etch rate was much lower at the edges of the wafer than at the middle. Moreover, the magnitude of the low-K etch was higher when photoresist had been removed from the wafer than when it was present.

Figure 3:
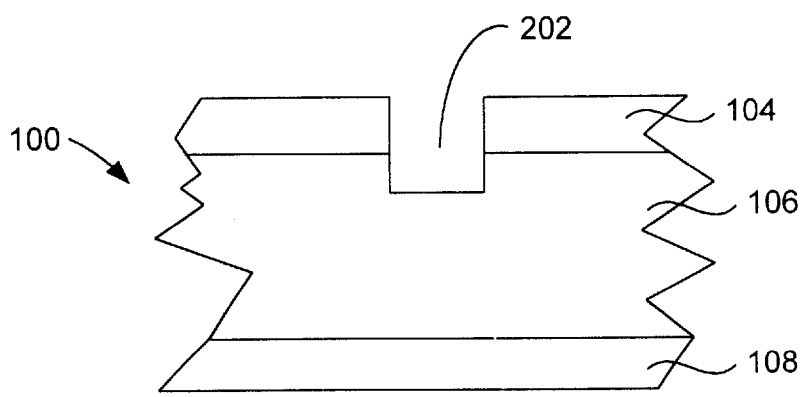
FIG. 3 is a cross-section through the representative stack disposed on a substrate during a low-K etching step, where the photoresist layer been substantially removed.
Figure 8:
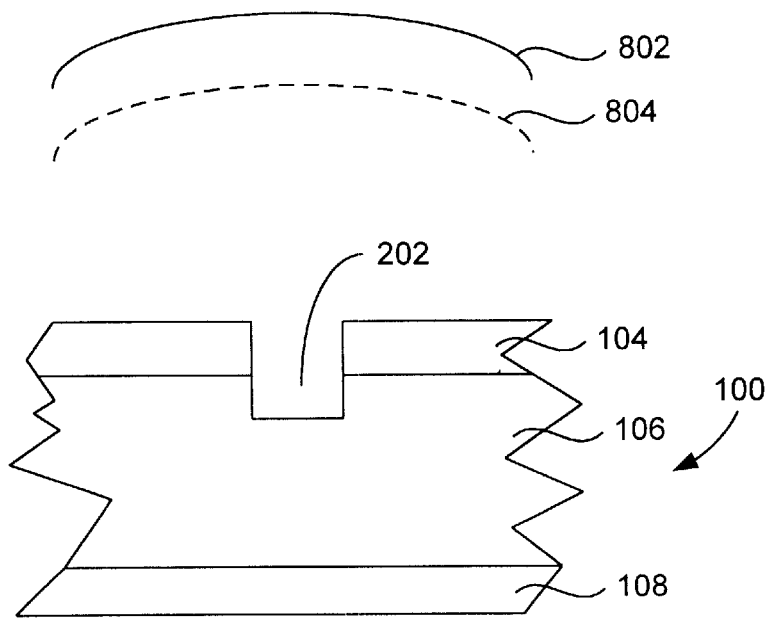
FIG. 8 is a cross-section through the representative stack disposed on a substrate during a low-K etching step, where the photoresist layer been substantially removed, showing the etch rate across the wafer diameter, and the plasma ion flux during the etch.

Having reference to FIG. 8, the results of this second test are shown. FIG. 8 depicts a cross-section through a wafer stack 100 as in FIG. 3, the cross section shown during the low-K etch process while photoresist 102 has been substantially removed. The plasma etch ion flux is shown at 804, and the postulated O species density shown at 802. At 802, it is shown that the O species density is lower at the edges and higher towards the center of the wafer during oxygen based etching in the absence of an organic photoresist.

In view of these findings, what was clearly needed was a methodology to offset the non-uniformities during the two etching regimes: where PR is substantially present, and where it is absent. In order to accomplish this, the present invention teaches offsetting the non-uniform O distribution across the wafer by coupling more power through the portion of the wafer having reduced O levels. This is done by performing a two-step etch process, under differing conditions of plasma power coupling, hereafter described.

Prior art hot edge rings are typically made of a conductive material, i.e. Si. One of the features of conductive hot edge rings is that they tend to contain and reduce the power which is coupled through the wafer during wafer etch. In the experiments discussed herein, it was found that the use of a conductive hot edge ring results in increased edge etch rate and decreased center etch rate.

For at least one low-K material without a substantial amount, for instance >≈1%, of photoresist overlay, this results in the low-K material being etched in a very uniform fashion. In contrast the same low-K material, which has a substantial photoresist overlay, etches in a very non-uniform fashion.

In view of these findings, it was hypothesized that the use of an insulative edge ring might have the opposite effect. Testing of this hypothesis proved that it was correct. If the HER is made of an insulative material, e.g. quartz, the insulator at the wafer edge results in more power being coupled through the wafer. Consequently, the center etch rate increases and the edge etch rate decreases for both regimes. This results in SiLK® with a substantial photoresist overlay being etched in a very uniform fashion. In contrast, the SiLK® without the photoresist etches in a very non-uniform fashion. Moreover, it was found that simply covering a conductive hot edge ring with an insulating ring had the same effect as replacing the conductive hot edge ring with an insulative one.

From these various findings arise the present invention. In a first etching step while photoresist is present, the low-K material is etched using a first etchant including an oxygen-bearing compound and a hydrocarbon passivant in the presence of a radio-frequency insulative edge ring. When the photoresist is determined to be substantially cleared from the wafer, for instance by means of a clearing signal generated by detectors and end-point software, a second etching step is performed. In the second etching step, the low-K material is etched using a second etchant including an oxygen-bearing compound and a hydrocarbon passivant in the presence of a radio-frequency conductive edge ring. Hydrocarbons may, in accordance with another aspect of the present invention, further include hydrofluorocarbons. The several aspects of the present invention are shown and disclosed having reference to FIGS. 9–16.

Figure 9:
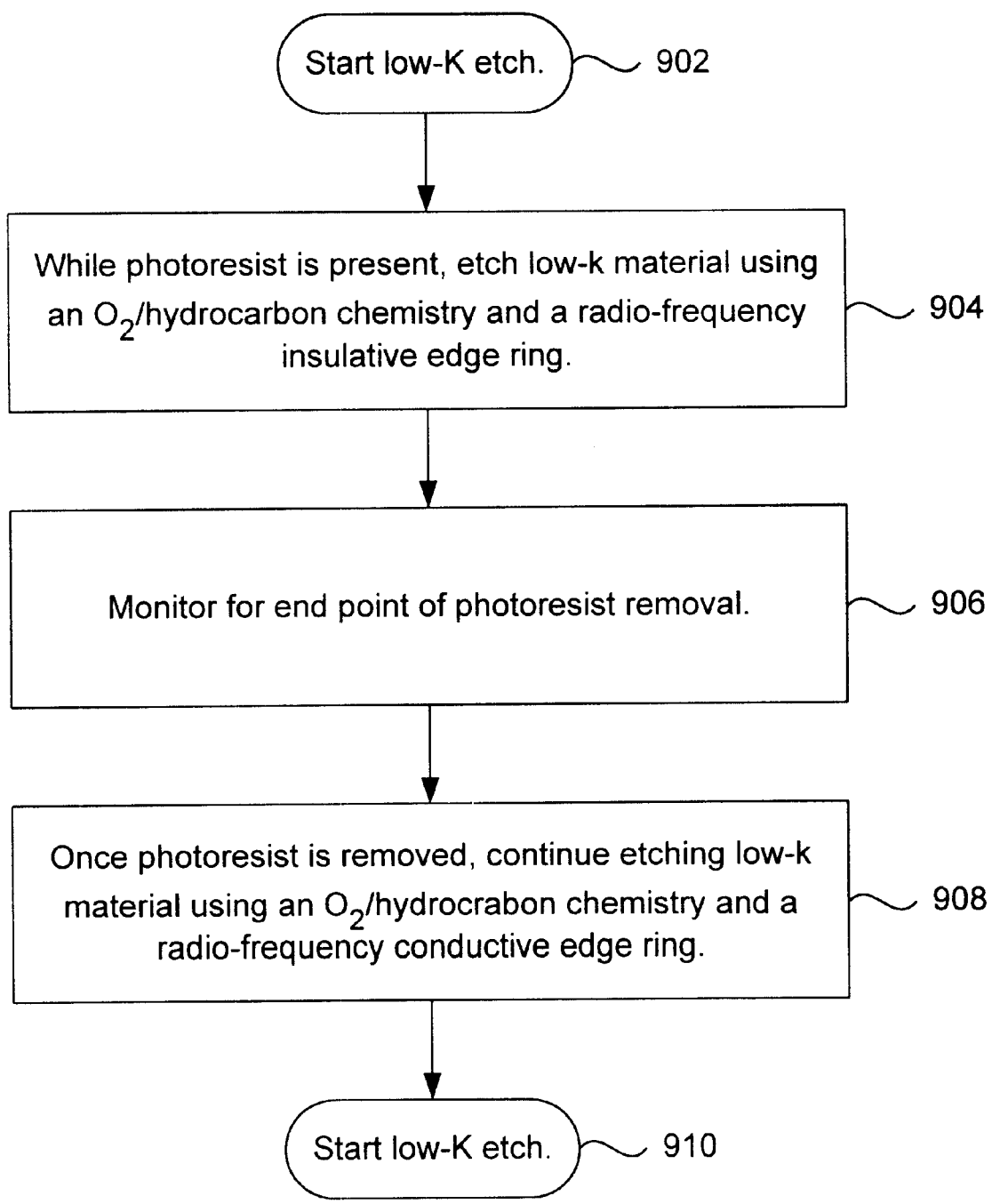
FIG. 9 is a flow chart representation of the methodology taught by the present invention.
Figure 13:
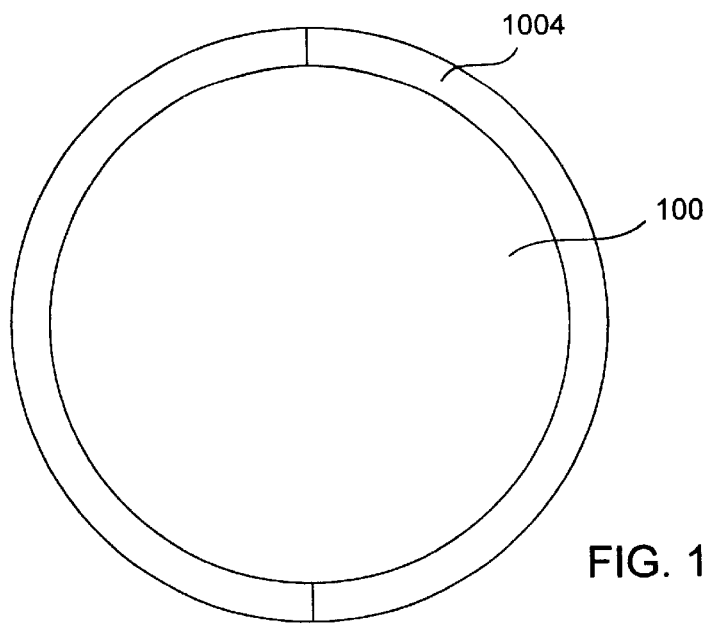
FIG. 13 is a plan view of wafer mounted on a wafer chuck, the wafer encircled by a conductive hot edge ring, the hot edge ring covered by an insulative edge ring cover formed of a plurality of arcuate dielectric edge cover segments.
Figure 14:
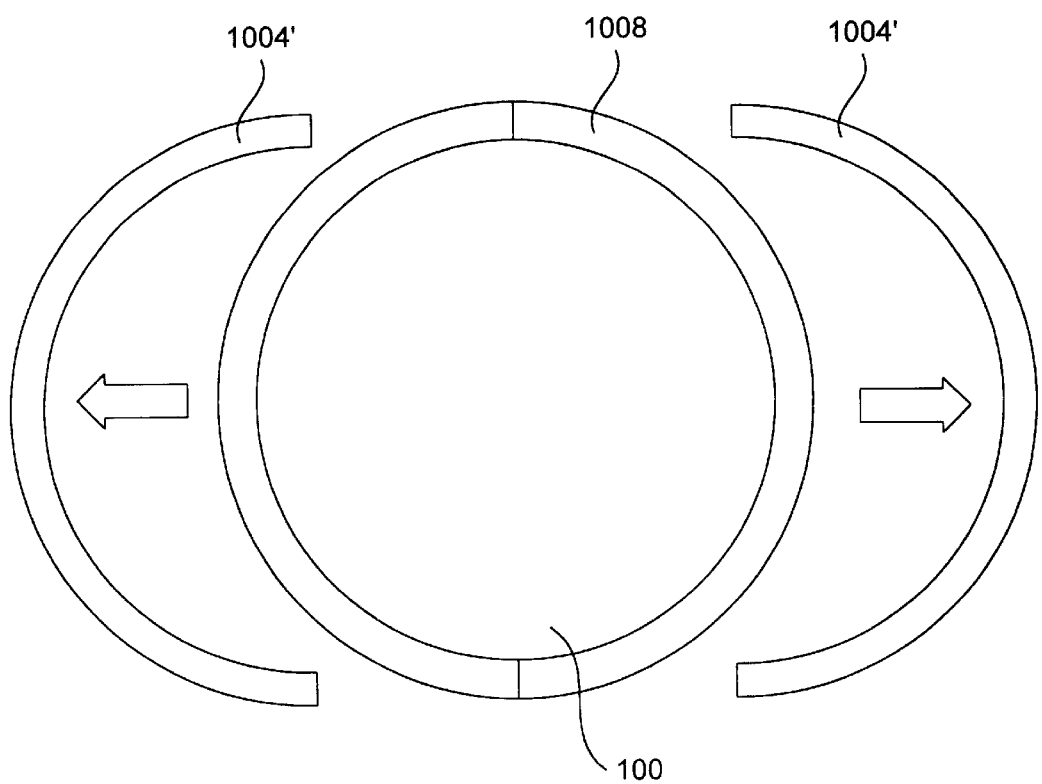
FIG. 14 is a plan view of wafer mounted on a wafer chuck, the wafer encircled by a conductive hot edge ring, the hot edge ring exposed by the withdrawal of the plurality of arcuate dielectric edge cover segments forming an insulative edge ring cover.

Referring now to FIG. 9, a flow chart representation of the process of the present invention is shown. At 902, the low-K etch process is started. At 904, a first etching step is conducted when substantial amounts of photoresist, for instance greater than about 1%, are present on the surface of the wafer stack. This etching step utilizes at least one of the previously discussed O2/hydrocarbon etchant/passivant combinations appropriate to the photoresist present. The etchant combination may further include one or more of the discussed diluents. This etching step is further conducted while the wafer is retained in the reactor vessel, and surrounded by a radio-frequency insulative edge ring, as described below.

Step 904 continues until, at 906, the endpoint of photoresist removal is detected. Endpoint may be selected from a range of endpoints from about 5% photoresist coverage to about 0% photoresist coverage, and preferably less than about 1% photoresist coverage. According to one aspect of the instant invention, photoresist endpoint detection may be performed by any of a number of known endpoint detection methods and apparatus.

Subsequent to the detection, at step 906, of the endpoint of photoresist removal, at step 908 etching of the low-K material continues with at least one of the previously discussed appropriate $O_2$/hydrocarbon etchant/passivant combinations. This combination may the same etchant/passivant combination, or it may be a different combination. The etchant combination may further include one or more of the discussed diluents. This etching step is still conducted while the wafer is retained in a reactor vessel, but in this case, the wafer is surrounded by a radio-frequency conductive edge ring, as described below. Etch step 908 continues until the desired feature is formed, or depth achieved through low-K layer 106, and etching ceases at step 901.

It should be noted that the present invention contemplates a number of differing aspects for carrying out this invention, as later described herein.

Figure 10:
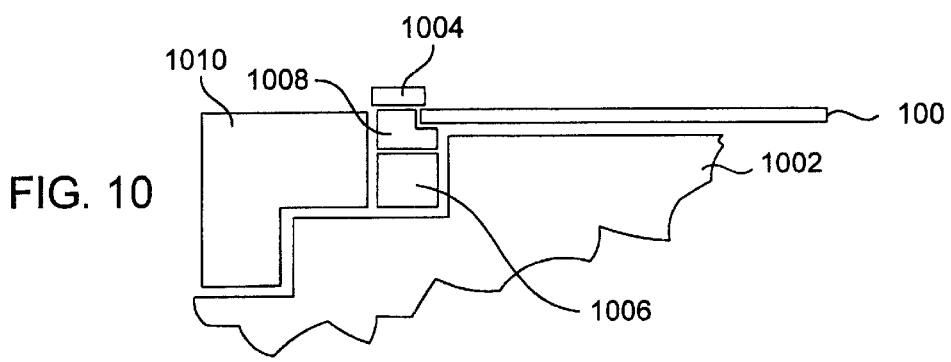
FIG. 10 is a partial cross-section through a wafer chuck having a wafer mounted thereon, the wafer encircled by a conductive hot edge ring, the hot edge ring covered by an insulative edge ring cover.

Referring now to FIG. 10, a first methodology for implementing one aspect of the present invention is shown. A chuck, for instance an electrostatic chuck, 1002 retains thereon a wafer, 100. Not shown in this view is the wafer stack including low-K, photoresist, and hardmask layers, as previously discussed. According to this aspect of the instant invention, there is provided a conductive hot edge ring 1008, which is coverable by insulative edge ring cover. Edge ring cover 1004 substantially covers conductive hot edge ring 1008, and may cover a small portion of the edge of wafer 100. Edge ring cover 1004 insulates hot edge ring 1008 from the plasma ion flux, not shown in this view, during step 904 of the method taught herein. Accordingly, since edge ring cover 1004 is made of an insulative material, it results in more power being coupled through the wafer. Consequently, the center etch rate increases and the edge etch rate decreases. This results in SiLK® or other low-K materials, having a substantial photoresist overlay, being etched very uniformly.

Radiofrequency insulative materials suitable for implementation of edge ring cover 1004 include but are specifically not limited to quartz, DuPont® Vespel®, DuPont® Kapton®. Other radiofrequency insulative or dielectric materials well known to those of ordinary skill in the art which are capable of withstanding the temperature and chemical environment of semiconductor wafer manufacture may, with equal facility, be substituted.

Figure 11:
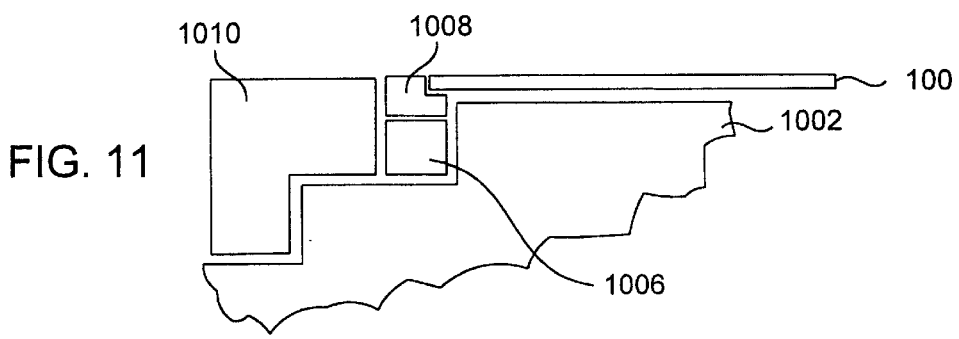
FIG. 11 is a partial cross-section through a wafer chuck having a wafer mounted thereon, the wafer encircled by a conductive hot edge ring.

Once the endpoint of photoresist removal is detected at step 906, edge ring cover 1004 is moved away from its covering of hot edge ring 1008, as shown at FIG. 11. Etching continues as at step 908 until the desired degree of low-K etch is completed, and etching ceases at 910.

According to this aspect of the present invention, wafer 100 is retained on a single chuck 1002 in a single reactor vessel for both etching steps 904 and 908. The principles of the present invention specifically contemplate however alternative aspects. According to another aspect, after wafer 100 is etched according to step 904, it is moved from one chuck 1002 to a second chuck, not shown, within the same reaction vessel, after step 906 in order to conduct step 908. According to another aspect, etching step 904 continues in one reactor vessel until step 906 is completed, at which time it is moved to a second reactor vessel where step 908 is conducted.

Also shown in FIGS. 10 and 11 are a number of optional chucking components, including a conductive coupling ring 1006. Conducting coupling ring 1006 may be formed of any number of conductive materials, including but specifically not limited to aluminum. The optional chucking components further include a focus ring 1010, which may be formed of aluminum oxide, $Al_2O_3$. It should be emphasized that the optional chucking components shown here are by way of example, and not limitation, as specific etching processes employing the principles enumerated herein may require these or other chucking components for controlling or monitoring the etching plasma.

Figure 12:
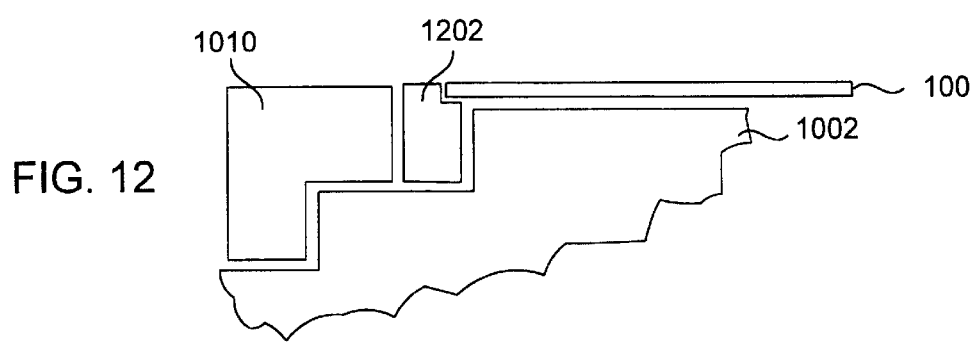
FIG. 12 is a partial cross-section through a wafer chuck having a wafer mounted thereon, the wafer encircled by a one-piece edge ring.

An alternative to the two-part coupling ring 1006 and hot edge ring 1008 is presented in FIG. 12. With reference to that figure, a one-piece edge ring 1202 may be utilized. This one piece edge ring may be a conductive edge ring fulfilling the function of hot edge ring 1008, or it may be an insulative edge ring fulfilling the function of insulative edge ring cover 1004. Where two separate edge rings are utilized as discussed, the present invention contemplates several methods for their implementation. According to one aspect, wafer 100 is etched according to step 904 at one chuck 1002 having an insulative edge ring 1202 until step 906 is completed, when it is moved to a second chuck 1002 having a conductive edge ring 1202 and etching continues as discussed at step 908. The first and second ones of chuck 1002 may be located in one reaction vessel, or a plurality of reaction vessels, as previously discussed. According to yet another aspect, the etching of wafer 100 is conducted at one chuck, and insulative and conductive ones of edge ring 1202 are sequentially moved in and out of position. This may or may not require re-positioning of wafer 100 on chuck 1002, as dictated by the geometry of edge ring 1202.

The instant invention contemplates a number of methodologies for removably covering hot edge ring 1008 with an insulating edge ring cover 1004. According to one such aspect, insulating edge ring cover 1004 may simply be moved away from its covering position over hot edge ring 1008 in once piece. According to another aspect, shown in FIGS. 13 and 14, insulating edge ring cover 1004 may be formed of a plurality of substantially arcuate sections 1004', each of which is moved away from hot edge ring 1008. Again, edge ring cover 1004, and its component sections 1004' may be formed of quartz, DuPont® Vespel®, DuPont® Kapton®, or other radiofrequency insulative or dielectric materials well known to those of ordinary skill in the art. Such materials should preferably be selected from those dielectrics that are capable of withstanding the temperature and chemical environment of semiconductor wafer manufacture.

Figure 15:
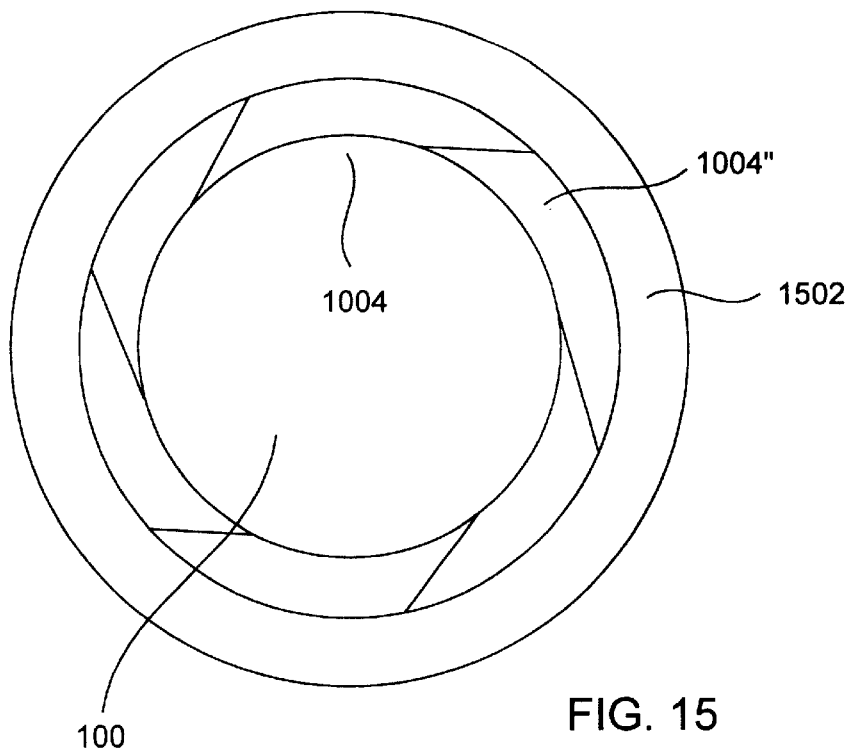
FIG. 15 is a plan view of wafer mounted on a wafer chuck, the wafer encircled by a conductive hot edge ring, the hot edge ring covered by an insulative edge ring cover formed of a iris incorporating a plurality of dielectric leaves.
Figure 16:
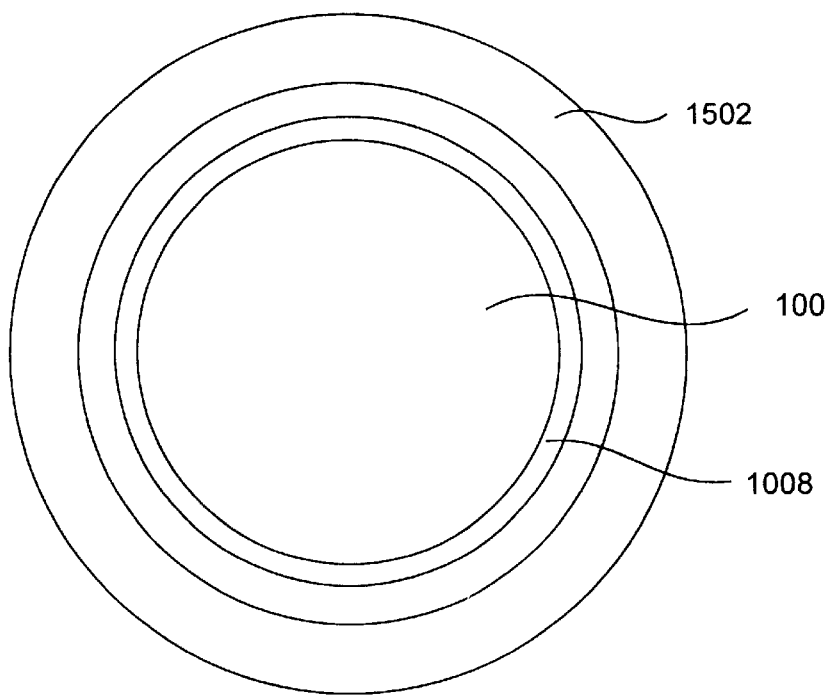
FIG. 16 is a plan view of wafer mounted on a wafer chuck, the wafer encircled by a conductive hot edge ring, the hot edge ring exposed by the withdrawal of a plurality of dielectric leaves forming a iris which further defines an insulative edge ring cover.

Still another aspect of the present invention is shown having reference to FIGS. 15 and 16. As shown in FIG. 15, according to this aspect, edge ring cover 1004 is formed of a plurality of overlapping leaves 1004" which are formed similarly to a photographic iris. Each of leaves 1004" preferably extends and retracts conjointly with the others of leaves 1004" When extended as shown in FIG. 15, the plurality of leaves 1004" form edge ring cover 1004, covering hot edge ring 1008, not shown in this view.

When the plurality of leaves 1004" are retracted, as shown at FIG. 16, they expose hot edge ring 1008, as shown at FIG.

16. Also shown at FIGS. 15 and 16 is optional iris cover 1502. Iris cover 1502 may preferably contain at least a portion of the mechanism, not shown, for extending and retracting the plurality of leaves 1004" forming edge ring cover 1004.

Again, leaves 1004" may be formed of quartz, DuPont® Vespel®, DuPont® Kapton®, or other radiofrequency insulative or dielectric materials well known to those of ordinary skill in the art. Such materials should also preferably be selected from those dielectrics which are capable of withstanding the temperature and chemical environment of semiconductor wafer manufacture.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the utilization of wide variety of etchants, diluents, passivants, insulators, dielectrics and conductors as discussed herein, or which will become evident upon the study of these principles to those having skill in the art. Each of these alternatives is specifically contemplated by the principles of the present invention.

What is claimed is:

1. A semiconductor device including a layer of low-K material, formed on a wafer by a method comprising:
    disposing the wafer in a reactor vessel;
    surrounding the wafer with an insulative edge ring;
    while the wafer is surrounded by the insulative edge ring, performing a first etch of the low-K material using an etchant gas mixture;
    surrounding the wafer with an exposed conductive hot edge ring subsequent to the first etch; and
    while the wafer is surrounded by the exposed conductive hot edge ring, performing a second etch of the low-K material using an etchant gas mixture.

2. The semiconductor device, as recited in claim 1, further comprising detecting an end point of a removal of a photoresist layer before surrounding the wafer with the exposed conductive hot edge ring.

3. The semiconductor device, as recited in claim 1, further comprising detecting when between 0% and 5% of an initial layer of photo resist is left before surrounding the wafer with the exposed conductive hot edge ring.

4. The semiconductor device of claim 3, wherein the surrounding the wafer with the insulative edge ring, comprises covering the conductive hot edge ring with the insulative edge ring, further comprising, responsive to the detecting step, exposing the conductive hot edge ring by removing the insulative edge ring from the conductive hot edge ring.

5. The semiconductor device of claim 4 wherein the covering the conductive hot edge ring comprises covering the conductive hot edge ring with one-piece insulative edge ring.

6. The semiconductor device of claim 4 wherein the covering the conductive hot edge ring comprises covering the conductive hot edge ring with a segmented insulative edge ring.

7. The semiconductor device of claim 4 wherein the covering the conductive hot edge ring comprises covering the conductive hot edge ring with an insulative edge ring iris.

8. The semiconductor device of claim 1 further comprising forming the insulative edge ring from one of a radiofrequency insulative material and a dielectric material.

9. The semiconductor device of claim 1 further comprising forming the insulative edge ring from a material selected from the group consisting of: quartz; Vespel®; and Kapton®.

10. The semiconductor device of claim 1 comprising the further step of selecting a single etchant gas mixture for the steps of performing a first etch and performing a second etch.

11. The semiconductor device of claim 10 wherein the step of selecting a single etchant gas mixture comprises the further step of selecting an etchant gas mixture including an etchant and a passivant.

12. The semiconductor device of claim 11 wherein the selecting an etchant gas mixture including an etchant and a passivant further includes selecting an etchant gas mixture including a passivant.

13. The semiconductor device of claim 11 further comprising selecting an oxygen-radical containing gas as an etchant.

14. The semiconductor device of claim 11 further comprising selecting one of a hydrocarbon and a fluorocarbon as a passivant.

15. The semiconductor device of claim 14 further comprising selecting a hydrocarbon from the group consisting of: $CH_4$ and $C_2H_4$.

16. The semiconductor device of claim 11 further comprising adding a diluent to the etchant gas mixture.

17. A semiconductor device formed on a wafer including a layer of low-K material by a method for etching the layer of low-K material, the method comprising:
    disposing the wafer in a reactor vessel;
    surrounding the wafer with an insulative edge ring;
    while the wafer is surrounded by the insulative edge ring, performing a first etch of the low-K material using an etchant gas mixture;
    detecting an end point;
    surrounding the wafer with an exposed conductive hot edge ring subsequent to detecting the end point; and
    while the wafer is surrounded by the exposed conductive hot edge ring, performing a second etch of the low-K material using an etchant gas mixture.

18. The semiconductor device, as recited in claim 17, wherein the detecting of the end point detects the end point of a removal of a photoresist layer.

19. The semiconductor device, as recited in claim 17, wherein the detecting of the end point detects when between 0% and 5% of an initial layer of photo resist is left.

* * * * *